(12) United States Patent
Decker et al.

(10) Patent No.: US 10,249,612 B2
(45) Date of Patent: Apr. 2, 2019

(54) SEMICONDUCTOR DEVICE INCLUDING SELF-PROTECTING CURRENT SENSOR

(71) Applicant: Infineon Technologies AG, Neubiberg (DE)

(72) Inventors: Stefan Decker, Munich (DE); Robert Illing, Finkenstein (AT); Michael Nelhiebel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 410 days.

(21) Appl. No.: 14/709,583

(22) Filed: May 12, 2015

(65) Prior Publication Data

US 2015/0333060 A1    Nov. 19, 2015

(30) Foreign Application Priority Data

May 14, 2014   (DE) .......................... 10 2014 106 825

(51) Int. Cl.
| | |
|---|---|
| *H01L 27/088* | (2006.01) |
| *H01L 27/02* | (2006.01) |
| *H01L 29/06* | (2006.01) |
| *H01L 29/78* | (2006.01) |
| *H01L 23/62* | (2006.01) |

(52) U.S. Cl.
CPC ........ *H01L 27/0266* (2013.01); *H01L 27/088* (2013.01); *H01L 29/0653* (2013.01); *H01L 29/7827* (2013.01); *H01L 23/62* (2013.01); *H01L 2924/0002* (2013.01)

(58) Field of Classification Search
CPC ............... H01L 27/0266; H01L 27/088; H01L 29/0653; H01L 29/7827
See application file for complete search history.

(56) References Cited

U.S. PATENT DOCUMENTS

| | | | |
|---|---|---|---|
| 8,502,274 B1 | 8/2013 | Matoy et al. | |
| 2005/0167742 A1* | 8/2005 | Challa ................. | H01L 21/3065 257/328 |
| 2008/0210978 A1* | 9/2008 | Yabu ................... | H01L 27/0207 257/202 |
| 2010/0270586 A1 | 10/2010 | Ueno | |

(Continued)

FOREIGN PATENT DOCUMENTS

| | | |
|---|---|---|
| CN | 101180737 A | 5/2008 |
| CN | 103367359 A | 10/2013 |

(Continued)

*Primary Examiner* — Matthew E. Gordon
(74) *Attorney, Agent, or Firm* — Murphy, Bilak & Homiller, PLLC (57) ABSTRACT

A semiconductor device includes a semiconductor body having a first surface and a second surface opposite to the first surface. The semiconductor body includes a load current component having a load current transistor area and a sensor component including a sensor transistor area. The sensor transistor area has first and third transistor area parts differing from a second transistor area part between the first and third transistor area parts by a sensor transistor area element being absent in the second transistor area part. The second transistor area part is electrically disconnected from a parallel connection of the first and third transistor area parts by the sensor transistor area element being absent in the second transistor area part.

10 Claims, 12 Drawing Sheets

(56) References Cited

U.S. PATENT DOCUMENTS

2013/0207192 A1 8/2013 Parthasarathy et al.
2014/0015046 A1 1/2014 Thiele et al.

FOREIGN PATENT DOCUMENTS

| CN | 103545349 A | 1/2014 |
|---|---|---|
| DE | 202004021424 U1 | 2/2008 |
| DE | 102013103378 A1 | 10/2013 |

\* cited by examiner

SEMICONDUCTOR DEVICE INCLUDING SELF-PROTECTING CURRENT SENSOR

PRIORITY CLAIM

This application claims priority to German Patent Application No. 10 2014 106 825.4 filed on 14 May 2014, the content said application incorporated herein by reference in its entirety.

BACKGROUND

A key component in semiconductor application is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In order to realize self-protecting MOS power switches, it is customary inter alia to integrate a current sensor. The current sensor may be realized as a small sensor transistor, which supplies a current proportional to the load current flowing through the load transistor. The sensor transistor is substantially smaller, e.g. a factor of 1000-10 000 smaller than the load transistor, and a sensor current flowing through the sensor transistor is smaller than the load current through load transistor ideally by the geometrical ratio of the active areas of the two transistors, namely the load transistor and the sensor transistor.

In an operating state, load and sensor currents may lead to a different increase of local temperature within the device due to different cooling capabilities of the load current component and the sensor component. An excessive increase of temperature within the sensor component may lead to a deterioration of the sensor component.

It is thus desirable to improve an operating characteristic of the sensor component integrated in the load current component.

SUMMARY

According to an embodiment of a semiconductor device, a semiconductor device comprises a semiconductor body having a first surface and a second surface opposite to the first surface. The semiconductor body comprises a load current component comprising a load current transistor area, and a sensor component comprising a sensor transistor area. The sensor transistor area comprises first and third transistor area parts differing from a second transistor area part between the first and third transistor area parts by a sensor transistor area element absent in the second transistor area part. The second transistor area part is electrically disconnected from a parallel connection of the first and third transistor area parts by the sensor transistor area element being absent in the second transistor area part.

According to another embodiment of a semiconductor device, a semiconductor device comprises a semiconductor body having a first surface and a second surface opposite to the first surface. The semiconductor body comprises a load current component comprising a load current transistor area, and a sensor component comprising a sensor transistor area. The load current transistor area and the sensor transistor area share a same transistor unit construction. The load current transistor area comprises first and second transistor area parts and the sensor transistor area comprises a third transistor area part. The first and third transistor area parts differ from the second transistor area part between the first and third transistor area parts by a load current transistor area element absent in the second transistor area part. The second transistor area part is electrically disconnected from a parallel connection of the first and second transistor area parts by the load current transistor area element being absent in the second transistor area part.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region. The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

It is to be understood that the features of the various embodiments described herein may be combined with each other, unless specifically noted otherwise.

Figure 1:
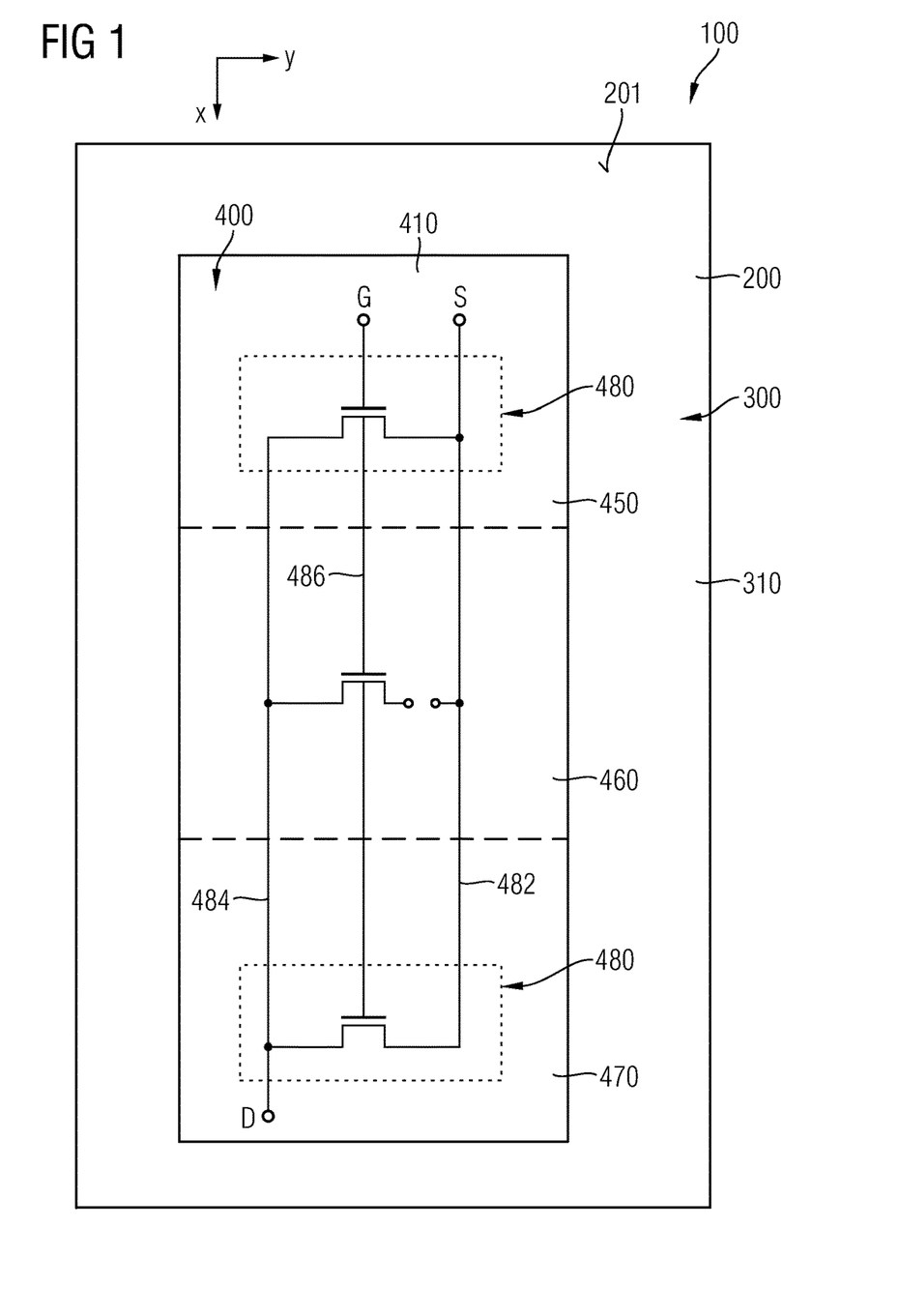
FIG. 1 is a schematic plan view including a schematic diagram of a portion of a semiconductor device according to an embodiment.

FIG. 1 is a schematic plan view including a schematic diagram of a portion of a semiconductor device 100 according to an embodiment. The semiconductor device 100 comprises a semiconductor body 200 having a first surface 201 and a second surface 202 (as shown, for example, in FIG. 4A) opposite to the first surface 201. The semiconductor body 200 comprises a load current component 300 comprising a load current transistor area 310, and a sensor component 400 comprising a sensor transistor area 410. The sensor transistor area 410 comprises a first transistor area part 450, a second transistor area part 460, and a third transistor area part 470. The first and third transistor area parts 450, 470 differ from the second transistor area part 460 between the first and third transistor area parts 450, 470 by a sensor transistor area element 480 absent in the second transistor area part 460. The absent sensor transistor area element 480 electrically disconnects the second transistor area part 460 from a parallel connection of the first and third transistor area parts 450, 470.

The sensor transistor area element 480 may be a source region of the sensor transistor area 410. In another embodiment, the sensor transistor area element 480 may be an electric contact structure on a source region of the sensor transistor area 410. As can be seen from the schematic circuit diagram, any transistor element within the dashed line surrounding the schematic transistor symbol leading to a disconnection of the second transistor area part 460 from a parallel connection of the first and third transistor area parts 450, 470 may act as a sensor transistor area element 480.

In the embodiment shown in FIG. 1, the sensor transistor area 410 is at least partly surrounded by the load current transistor area 310. The sensor transistor area 410 may also be arranged at a boundary portion of one or more of the four sides of the load current transistor area 310. The first to third transistor area parts 450 to 470 may be arranged along a first lateral direction x. In this case, source regions of the first and third transistor area parts 450, 470 may be electrically coupled by a conductive line 482, which is extended along the first direction x. In the schematic circuit shown in FIG. 1, the transistors in the first to third transistor area parts 450 to 470 are connected in parallel by a common source line, the conductive line 482, electrically coupled to a source terminal S. The transistors in the first to third transistor area parts 450 to 470 are connected to a common drain terminal D via a current path 484. The transistors in the first to third transistor area parts 450 to 470 are controlled by a common gate line 486 electrically coupled to a gate terminal G. The direction of the current through the semiconductor device 100 may be orthogonal to the first lateral direction x and the second lateral direction y, i.e. orthogonal to the first surface 201.

Figure 2:
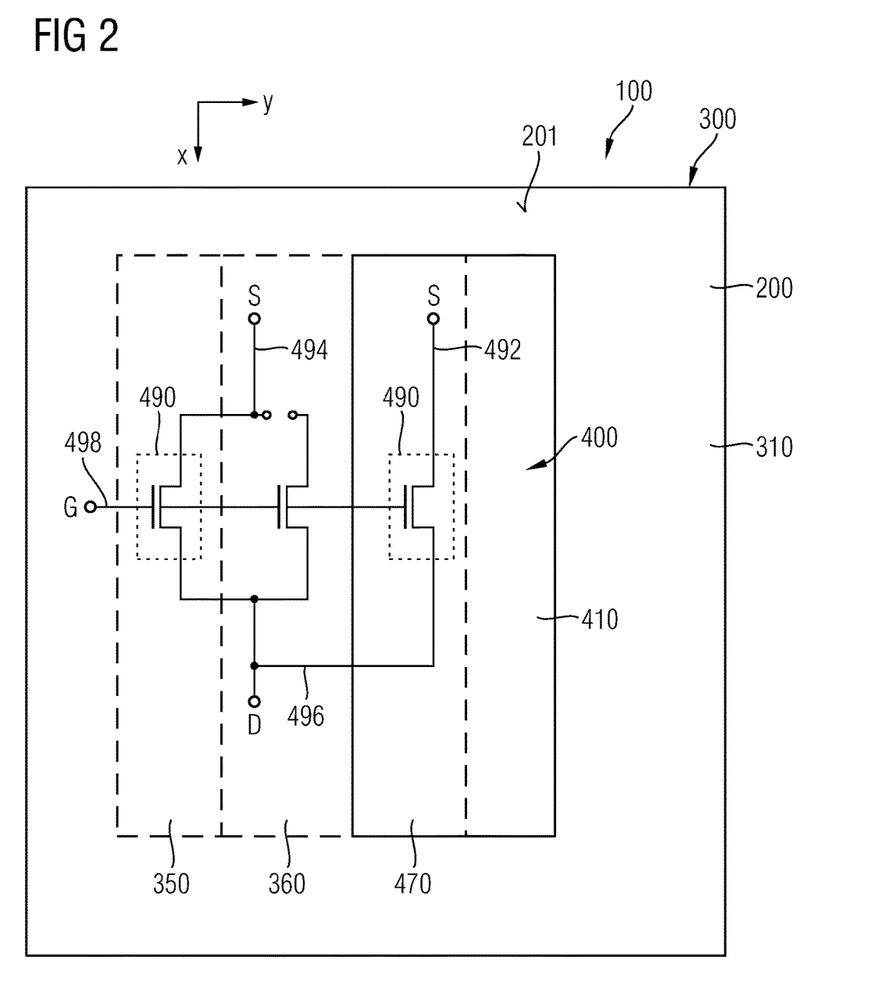
FIG. 2 is a schematic plan view including a schematic diagram of a portion of a semiconductor device according to another embodiment.

FIG. 2 is a schematic plan view including a schematic diagram of a portion of a semiconductor device 100 according to another embodiment. In this embodiment, the load current transistor area 310 and the sensor transistor area 410 share a same transistor unit construction. The load current transistor area 310 comprises a first transistor area part 350 and a second transistor area part 360. The sensor transistor area comprises the third transistor area part 470. The first and third transistor area parts 350, 470 differ from the second transistor area part 350 between the first and third transistor area parts 350, 370 by a load current transistor area element 490 absent in the second transistor area part 360. The load current transistor area element 490 absent in the second transistor area part 360 electrically disconnects the second transistor area part 360 from a parallel connection of the first and second transistor area parts 350, 360. As can be seen from FIG. 2, the transistor in the third transistor area part 470 of the sensor transistor area 410 is connected to a source terminal S by a separate source line 492 next to the source line 494 of the transistors of the first and second transistor area parts 350, 360 of the load current transistor area 310. The transistors of all transistor area parts 350, 360, 470 are connected to a common drain terminal D via a conductive path 496. All transistors are controlled by a common gate line 498 connected to a gate terminal G.

The load transistor area element 490 may be a source region of the load current transistor area 310. In another embodiment, the load current transistor area element 490 may be an electric contact structure on a source region of the load current transistor area 310. The first to third transistor area parts 350, 360 and 370 may be arranged consecutively in the second lateral direction y. The current through the semiconductor device 100 may be directed in a orthogonal direction to the first and second lateral directions X, Y, wherein the common drain terminal D may be located at the second surface 202 of the semiconductor body 200 (as, for example, shown in FIG. 4A).

Due to the deactivation of the second transistor area part 460 within the sensor transistor area 410 in FIG. 1, or the deactivation of the second transistor area part 360 within the load current transistor area 310 in FIG. 2, the current density through the sensor component 400 (FIG. 1) or through a transition part between the sensor component 400 and the load current component 300 can be reduced, thereby counteracting a mismatch of thermal coupling between the sensor component 400 and the load current component 300, e.g. caused by a missing electric connection structure between the sensor component 400 and a power metallization, for example.

Figure 3:
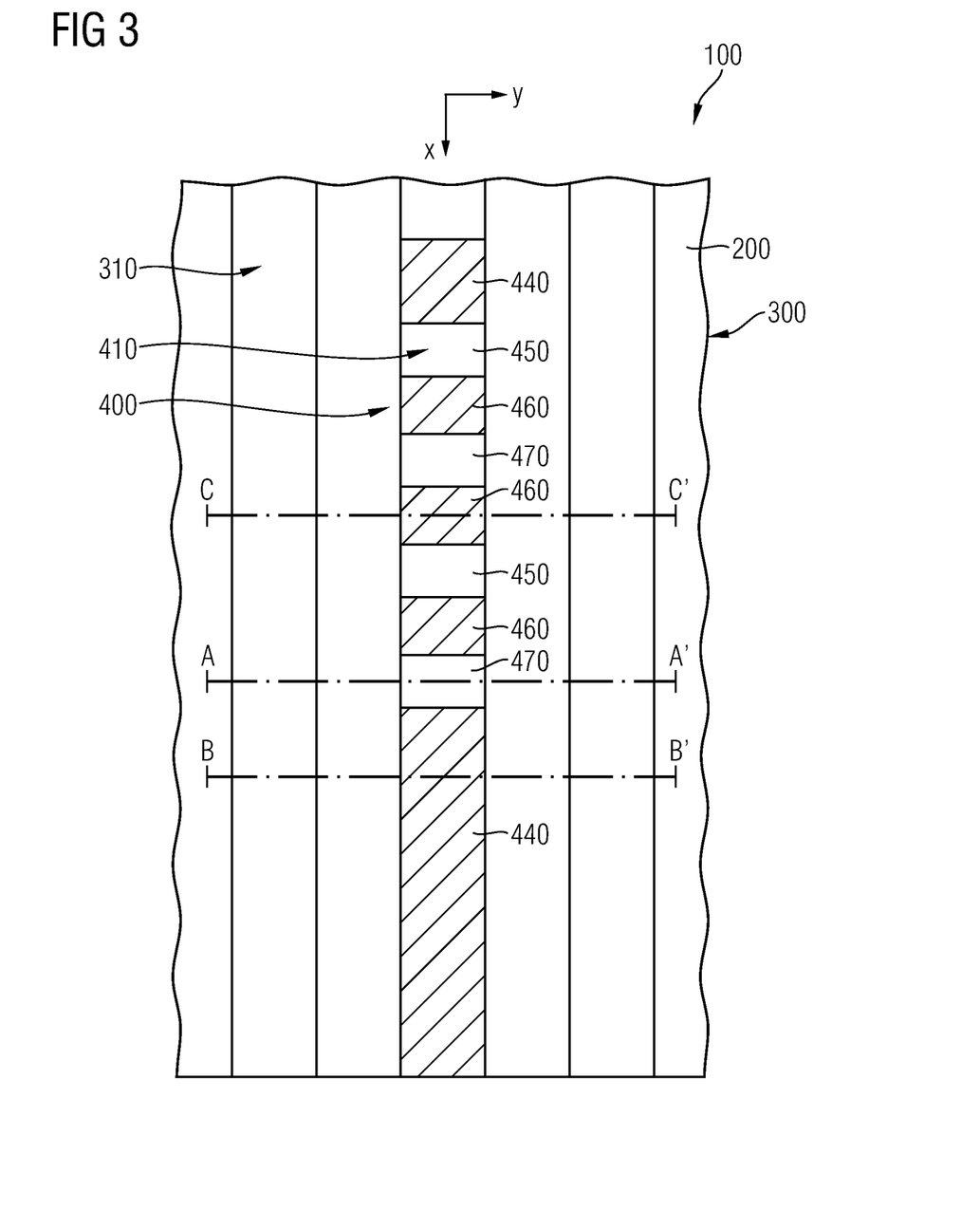
FIG. 3 is a schematic plan view of a portion of a semiconductor device according to the embodiment of FIG. 1.

FIG. 3 is a schematic plan view of a portion of the semiconductor device 100 according to an embodiment as illustrated in FIG. 1. As can be seen from FIG. 3, the sensor component 400 comprises the sensor transistor area 410, and further comprises non-active areas 440, which neighbour the sensor transistor area 410 including the first to third transistor area parts 450 to 470. The non-active areas 440 are arranged in a first lateral direction x together with the first to third transistor area parts 450 to 470.

In the following, the embodiment of the semiconductor device 100 as shown in the plan view of FIG. 3 will be discussed in detail with regard to FIG. 4A, being one embodiment of a cross-sectional view of FIG. 3 taken along the section plane A-A', with regard to FIG. 4B, being one embodiment of a cross-sectional view of FIG. 3 taken along the section plane B-B', and with regard to FIG. 5A to 5C, being one embodiment of a schematic cross-sectional views of a portion of the semiconductor device 100 of different embodiments along the section plane C-C' of FIG. 3.

The semiconductor device 100 includes the semiconductor body 200. The semiconductor body 200 includes a semiconductor material, for example silicon Si, silicon carbide SiC, germanium Ge, silicon germanium SiGe, gallium nitride GaN or gallium arsenide GaAs. The semiconductor body 200 may include a semiconductor layer structure having one or more semiconductor layer(s), e.g. epitaxial layer(s) on a semiconductor substrate. Outside the illustrated portion, the semiconductor body 200 may include, inter alia, further doped and undoped sections, semiconductor layers, insulating and conducting structures, for example.

The semiconductor body 200 has a first surface 201 and a second surface 202 which is opposite to the first surface 201. A distance between the first and second surfaces 201, 202 is selected to achieve a specified voltage blocking capability and may be at least 50 μm, for example at least 175 μm. Other embodiments may provide semiconductor bodies 200 with a thickness of several 100 μm. The semiconductor body 200 may have a rectangular shape with an edge length in the range of several millimeters. The normal to the first and second surfaces 201, 202 defines a vertical direction and directions orthogonal to the normal direction are lateral directions.

The semiconductor device 100 includes the load component 300 with the load current transistor area 310 and the sensor component 400 with the sensor transistor area 410. The load component 300 and the sensor component 400 may comprise transistor elements, e.g. transistor cells such as IGBTs (insulated gate bipolar transistors), e.g. RC-IGBTs (reverse-conducting IGBTs), RB-IGBT (reverse-blocking IGBTs, and IGFETs (insulated gate field effect transistors) including MOSFETs (metal oxide semiconductor field effect transistors).

Figure 4A:
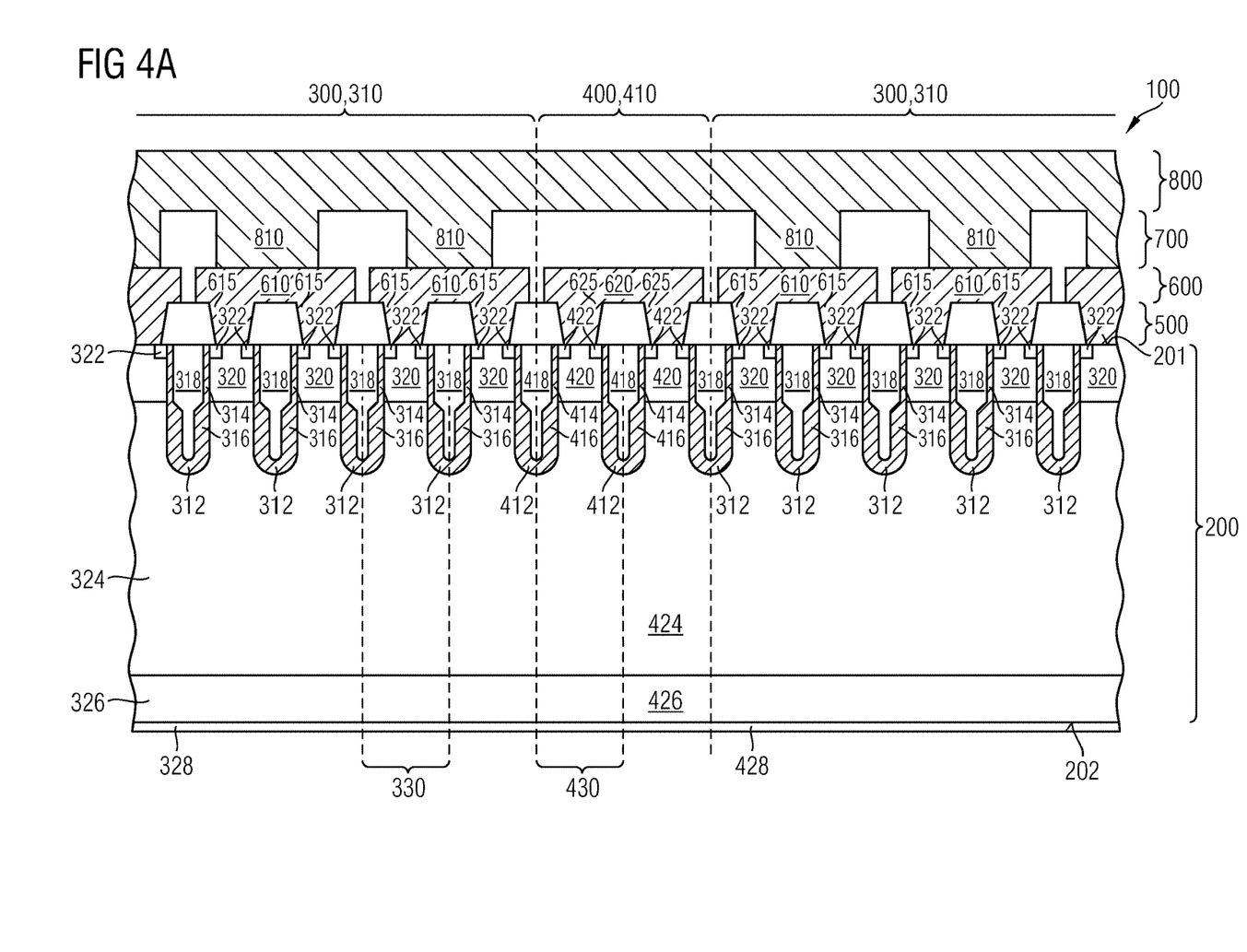
FIG. 4A is a schematic cross-sectional view of a portion of a semiconductor device taken along the section plane A-A' of FIGS. 3, 6 according to an embodiment.

In the embodiment shown in FIG. 4A, the load component 300 comprises a plurality of load current transistor units 330 forming vertical IGFETs within the load current transistor area 310. First trenches 312 extend from the first surface 201 in a vertical direction into the semiconductor body 200. The first trenches 312 are formed in an upper part with a gate dielectric structure 314, e.g. a gate oxide structure adjoining the semiconductor body. The gate dielectric structure 314 merges into a field dielectric structure 316, e.g. a field oxide structure in a lower part of the trenches 312. The trenches 312 are filled with an electrode structure 318. The electrode structure 318 serves as a field electrode in the lower part of the trenches 312 and as a gate electrode for controlling a channel conductivity of the load current transistor unit 330 in the upper part of the trenches 312. According to another embodiment, the load current transistor unit 330 may include a gate electrode but no field electrode. According to yet another embodiment, the load current transistor unit 330 includes one, two, three or even more field electrodes. The field electrodes may be electrically separated from each other by a dielectric. The field electrodes may also be electrically coupled to a same reference voltage, e.g. a source potential or to different reference voltage(s).

In each load current transistor unit 330, body zones 320 are additionally formed in a mesa zone between adjacent trenches 312. Within the body zone 320, source zones 322 are likewise provided in a manner adjoining the gate dielectric structure 314, the source zones 322 reaching as far as the first surface 201 of the semiconductor body 200. The body zone 320 adjoins a drift zone 324 guiding a gate-controlled current between the source zone 322 and a common drain zone 326 at the second surface 202 of the semiconductor body 200. The first trenches 312 extend from the first surface 201 through the body zones 320 into the drift zone 324. The source zones 322, the drift zone 324, and the drain zone 326 are of a first conductivity type, wherein the body zone 320 is of a second conductivity type. On the second surface 202, a drain electrode 328 may be provided to electrically contact the common drain zone 326.

The sensor component 400 comprises a plurality of sensor transistor units 430 forming vertical IGFETs within the sensor transistor area 410. As can be seen from FIG. 4A, the construction of the load current transistor unit 330 and the sensor transistor unit 430 may be the same. In detail, the second trenches 412 each comprising a gate dielectric structure 414, a field dielectric structure 416 and an electrode structure 418 correspond to the first trenches 312 each comprising the gate dielectric 314, the field dielectric structure 316 and the electrode structure 318 in terms of geometry, and construction with respect to the cross-section as illustrated in FIG. 4A. Furthermore, the arrangement of the source zones 422 and the body zones 420 of the sensor component 400 corresponds to the arrangement of the source zones 322 and the body zones 320 of the load current component 300. The drift zone 424, the drain region 426 and the drain electrode 328 of the sensor component 400 are common with the drift zone 324, the drain zone 326 and the drain electrode 328 of the load current component 300.

Thus, the sensor transistor area 410 is integrated into the load current transistor area 310 without interruptions or disturbances of the transistor unit arrangement. Furthermore, the first trenches 312 of the load current component 300 and the second trenches 412 of the sensor transistor area 410 of the sensor component 400 share same trench and mesa dimensions. The source regions 422 of the sensor transistor area 410 and the source regions 322 of the load current transistor area 310 may be at the first surface 201 of the semiconductor body 200, wherein a common drain region 326, 426 may be at the second surface 202 of the semiconductor body 200. The first trenches 312 and the second trenches 412 each comprise a gate electrode (the electrode structure 318), wherein the gate electrodes are electrically coupled with each other. Thus, the same gate potential is applied to gate electrodes of the first and second trenches 312, 314, respectively, comprising the gate electrodes within both the load current component 300 and the sensor component 400.

As can be seen from FIG. 4A, a first isolation layer 500 is formed on the first surface 201 of the semiconductor body 200. A first wiring layer 600 on the first isolation layer 500 comprises a load current contact structure 610, which is electrically coupled to the load current transistor area 310, and a sensor contact structure 620, which is electrically coupled to the sensor transistor area 410. A second isolation layer 700 is formed on the first wiring layer 600. On the second isolation layer 700, a second wiring layer 800 overlaps the load current transistor area 310 and the sensor transistor area 410. The second wiring layer 800 may comprise a power metallization adapted to conduct high currents from a semiconductor device surface to the first wiring layer 600, which distributes the current to the source zones 322. The second wiring layer 800 is electrically coupled to the load current contact structure 610 by means of an electric connection structure comprising vias 810 extending through the second isolation layer 700. The second wiring layer 800 is electrically isolated from the sensor contact structure 620, allowing for a separate measurement of the current flowing through the sensor component 400 with respect to the load current component 300. According to an embodiment, the vias 810 may have a rectangular form or a circular form in a lateral plane direction x, y. The diameter of a via 810 may be in a range of 2 μm to 5 μm. The vias 810 may have a square form in the lateral plane x, y and may have a side length in a range of 2 μm to 5 μm.

An electric contact structure 625 electrically connects the sensor contact structure 620 with the source zones 422 of the sensor transistor area 410. The electric contact structure 625 extends through the first isolation layer 500. A further electric contact structure 615 electrically connects the load current contact structure 610 with the source zones 322 of the load current transistor area 310. The further electric contact structure 615 is also extended through the first isolation layer 500. The electric contact structure 625 and the further electric contact structure 615 may be formed as vias, plugs or as contact lines extended along a lateral direction, for example along the first lateral direction x.

As shown in FIG. 4A, the source zones 322 of the load current component 300 (and the source zones 422 of the sensor component 400) may be formed as stripes embedded in the body zone 320 (or 420) and extended in the first lateral direction x of FIG. 3, i.e. perpendicular to the drawing plane of FIG. 4A. Electric contact to the source and body zones 322, 422, 320, 420 may be provided from a top side to the source zones 322, 422 and the body zones 320, 420 in between. An optional highly doped body contact region may provided for reducing a contact resistance. In a same manner, the first trenches 312 (and the second trenches 412) may also be extended in the first lateral direction x of FIG. 3, wherein the respective source zones 322 (or 422) directly adjoin the first trenches 312 (or the second trenches 412).

In another embodiment, the source zones 322 (or 422) are alternately arranged with body contact areas of the body zone 320 (or 420) along the first lateral direction x of FIG. 3. Again, an optional highly doped body contact region may provided in the body contact areas for reducing a contact resistance.

In yet another embodiment, a source zone between the first trenches 312 (or second trenches 412) may be arranged on the body zone 320 (or 420), wherein the body zone 320 (or 420) may be contacted via a contact groove extending through the source zone, thereby forming a lateral electric contact to the source zone.

The load current contact structure 610 and the sensor current contact structure 620 may comprise conductive lines extending in parallel along the first lateral direction x of FIG. 3. According to the embodiment of FIG. 4A, one conductive line 610 (or 620) is connected with two transistor units 330 (or 430) via two electric contact structures 615 (or 625). However, it is also possible to electrically couple three transistor units 330 (or 430) or more together by one conductive line of the load current contact structure 610 (or 620). Also only one transistor unit 330 (or 430) may be separately contacted by one conductive line of the load current contact structure 610 (or 620).

The first wiring layer 600 and the second wiring layer 800 may consist of or contain, as main constituent(s), aluminum Al, copper Cu or alloys of aluminum or copper, for example AlSi, AlCu, or AlSiCu. According to other embodiments, the first wiring layer 600 and the second wiring layer 800 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, and/or Pd.

The first isolation layer 500 and the second isolation layer 700 may include any dielectric or a combination of dielectrics adapted to isolate the semiconductor body 200 from the first wiring layer 600, or the first wiring layer 600 from the second wiring layer 800. The first isolation layer 500 and the second layer 700 may include one or any combination of an oxide, a nitride, oxynitride, a high-k material, an imide, an insulating resin or glass such as a tetraethylorthosilicate (TEOS/undoped silicate glass (USG)) or a phosphosilicate glass (PSG) or a borophosphosilicate glass (BPSG), for example.

Figure 4B:
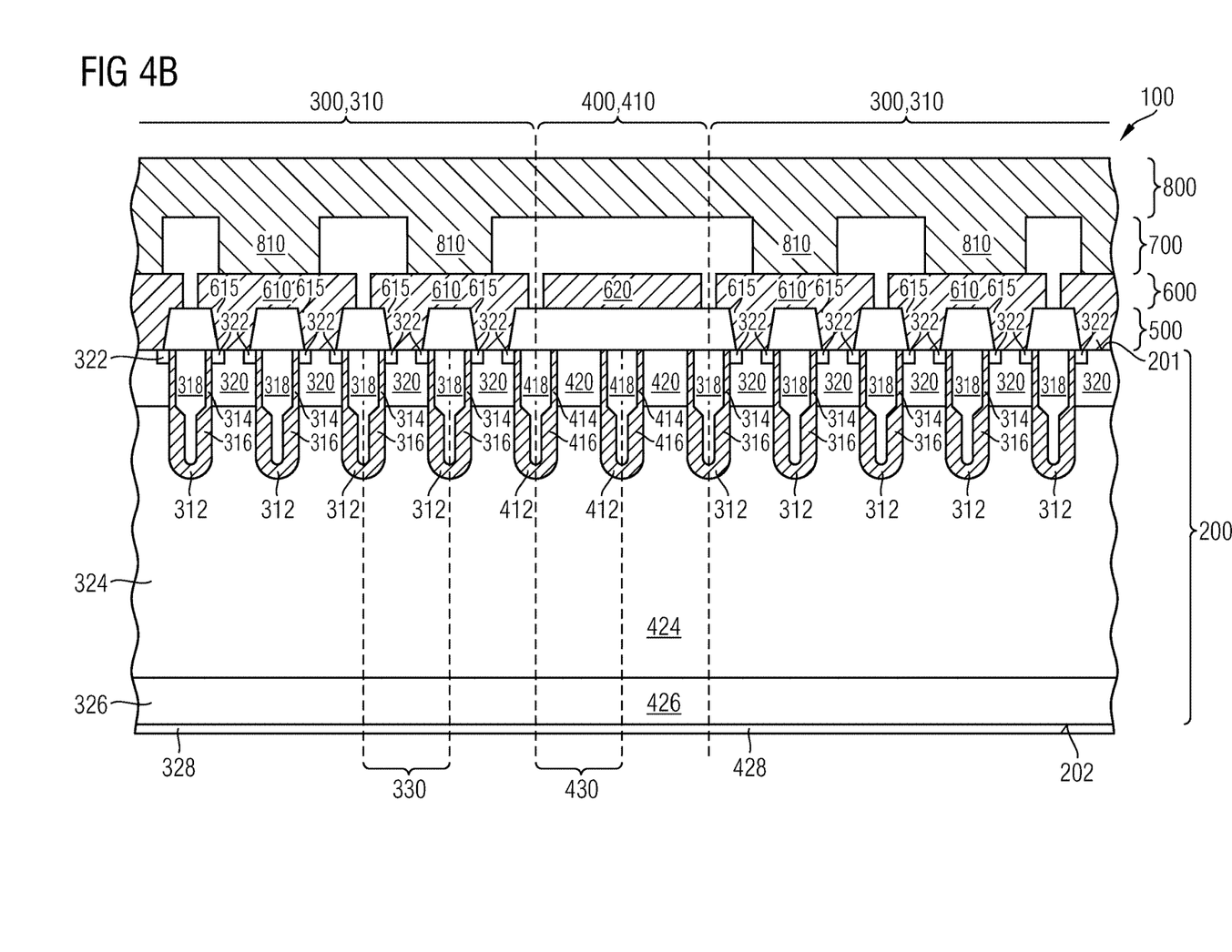
FIG. 4B is a schematic cross-sectional view of a portion of a semiconductor device taken along the section plane B-B' of FIGS. 3, 6 according to an embodiment.

As can be seen from FIG. 4B, the sensor current contact structure 620 is isolated from the semiconductor body 200 by the first isolation layer 500 within the non-active area 440 of the sensor component 400. The non-active area 440 is provided to guide the sensor contact structure 620 to a boundary portion of the semiconductor device 100 to enable a separate contact of the sensor component 400 from the load current component 300. A missing connection of the sensor current contact structure 620 to the second wiring layer 800 due to the absence of vias 810 may lead to an increased temperature in the sensor component 400 in comparison to the load current component 300 due to a reduced thermal dissipation.

Figure 5A:
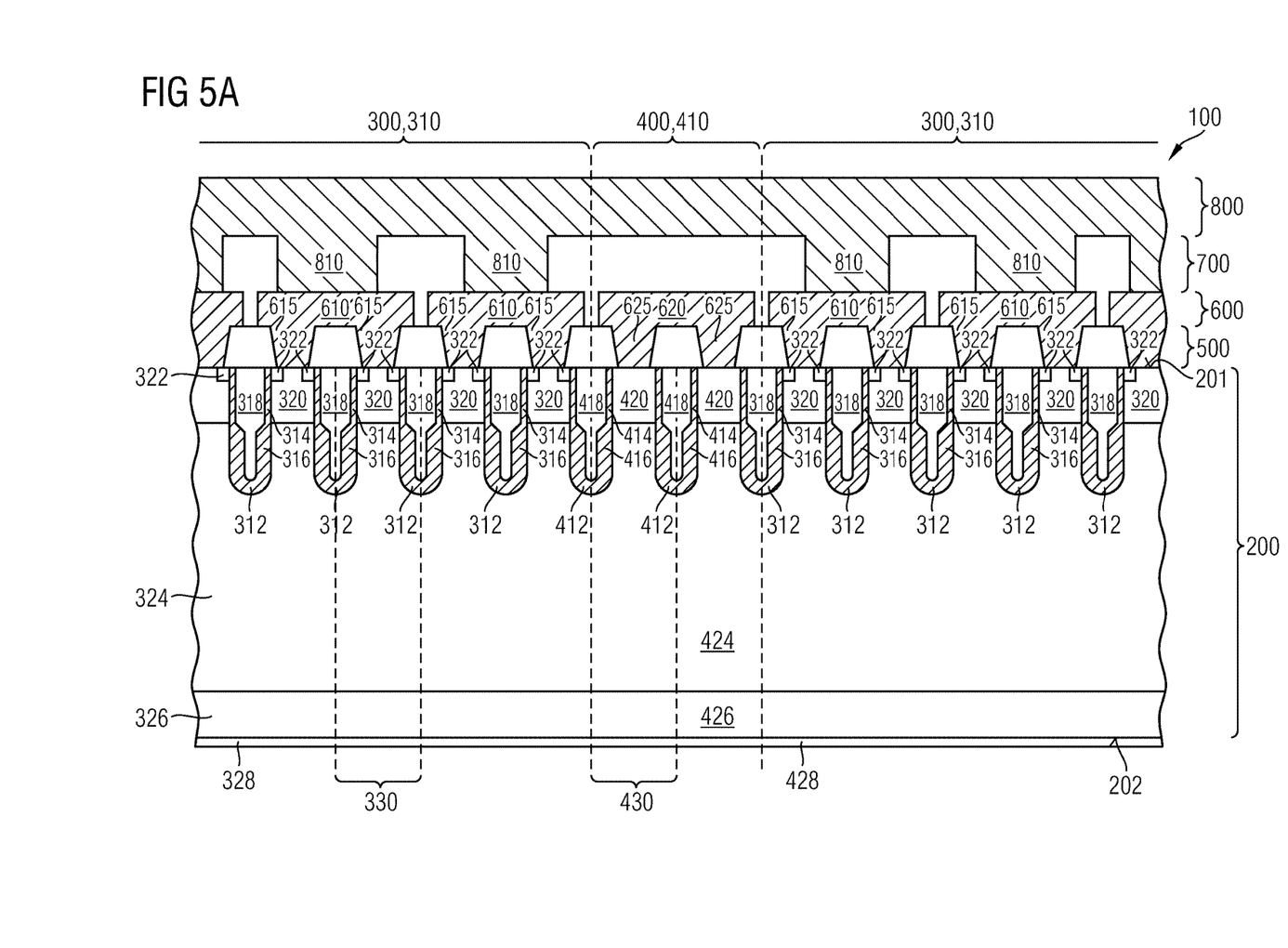
FIG. 5A to 5C are schematic cross-sectional views of a portion of a semiconductor device taken along the section plane C-C' of FIG. 3 according to different embodiments.
Figure 5B:
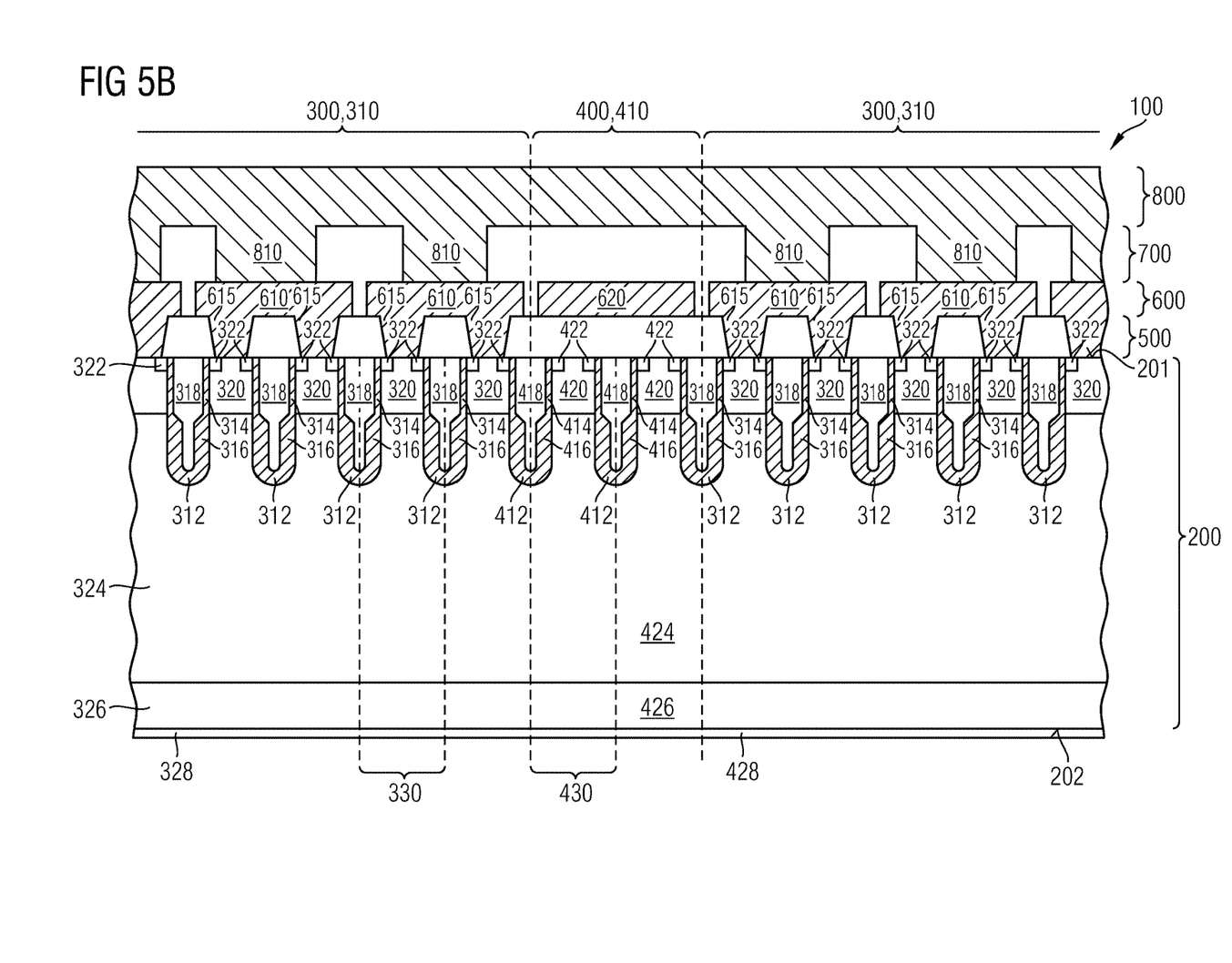
Figure 5C:
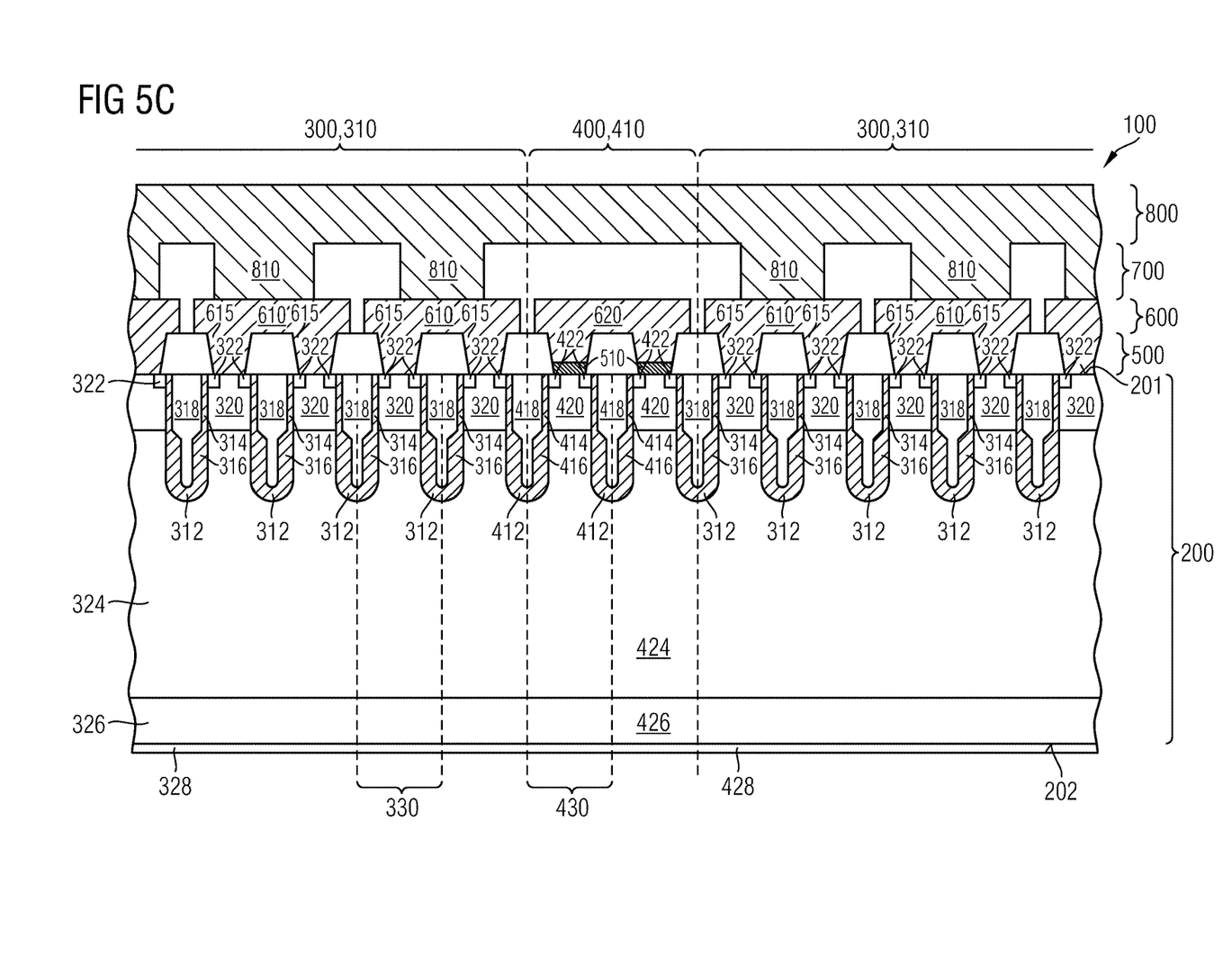

In the following, schematic cross-sectional views of a portion of a semiconductor device taken along the section plane C-C' of FIG. 3 will be discussed on the basis of FIG. 5A to 5C showing different embodiments. As can be seen from FIG. 3, the section plane C-C' crosses a deactivated area of the sensor transistor area 410, i.e. the second transistor area part 460, which is disconnected from a parallel connection of active areas of the sensor transistor area 410, i.e. the first and third transistor area parts 450, 470.

As can be seen from FIG. 5A, the source zones 422 within the second transistor area part 460 of the sensor transistor area 410 are absent, as can be seen from the comparison of the schematic cross-sectional view in FIG. 4A (depicting the first or third transistor area part 450, 470) and the cross-sectional view of FIG. 5A (depicting the second transistor area part 460). Thus, the sensor transistor area element 480 of FIG. 1 is a source region comprising the source zones 422 of the sensor transistor area 410 at the first surface 201 of the semiconductor body 200. Due to the absence of the source zones 422, a current from the sensor contact structure 620 via the electric contact structure 625 into the semiconductor body 200 to the drain region 426 is prevented. Thus, the second transistor area part 460 is electrically disconnected from a parallel connection of the first and third transistor area parts 450, 470 due to the absent sensor transistor area element 480 being a source region comprising the source zones 422 of the sensor transistor area 410.

FIG. 5B is a schematic cross-sectional view of a portion of a semiconductor device 100 along the section plane C-C' of FIG. 3 according to another embodiment. Those features of the embodiment of FIG. 5B being similar to the features of the embodiment of FIG. 5A will not be described again and reference is drawn to the details given above.

As can be seen from FIG. 5B, the sensor transistor area element 480 being absent within the second transistor area part 460 is the electric contact structure 625 electrically connecting the sensor contact structure 620 with a source region comprising the source zone 422 of the sensor transistor area 410. Due to the missing electrical contact of the source zones 422 with the sensor contact structure 620 due to the isolation by the first isolation layer 500, no current flows through the second transistor area part 460, leading to an electrical disconnection of the second transistor area part 460 from a parallel connection of the first and third transistor area parts 450, 470.

As shown in FIG. 5C, the absent sensor transistor area element 480 may also be a part of the electric contact structure 425 directly abutting the first surface 201 and the source regions 422. In the embodiment of FIG. 5C, this part of the electric contact structure 625 is replaced by an intermediate isolation layer 510 lying within the first isolation layer 500.

Figure 6:
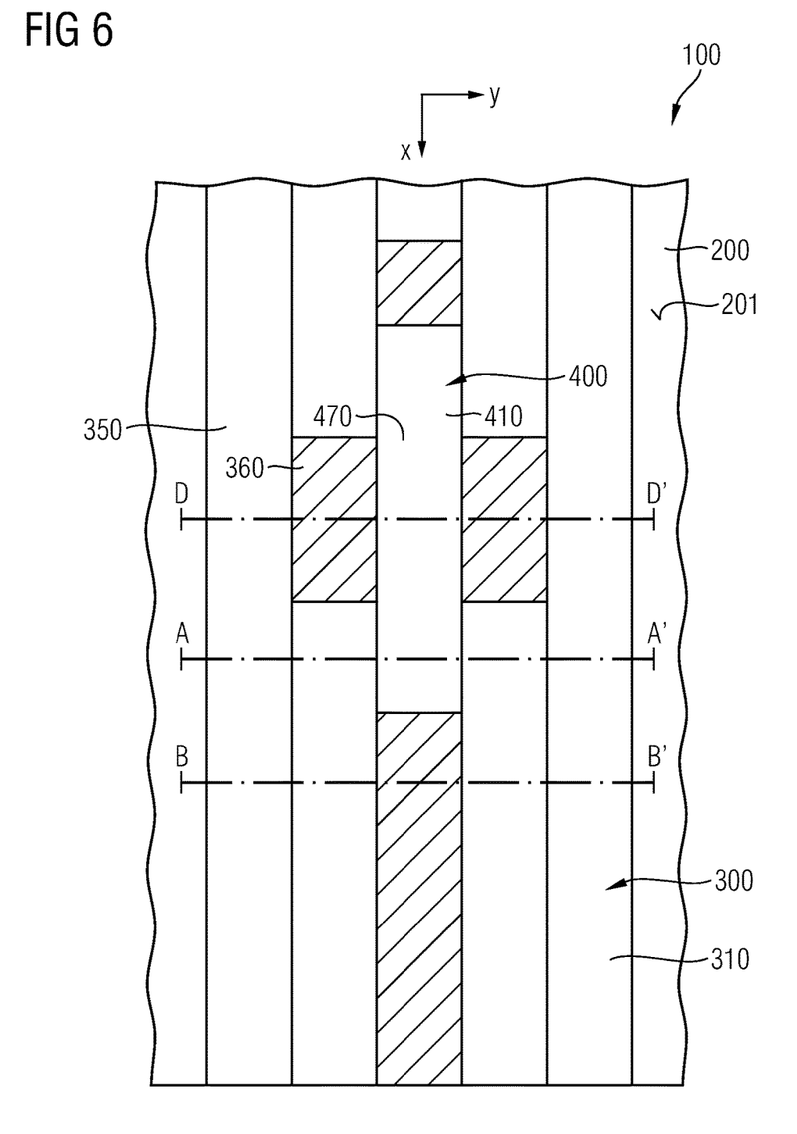
FIG. 6 is a schematic plan view of a portion of a semiconductor device according to the embodiment of FIG. 2.

FIG. 6 is a schematic plan view of a portion of a semiconductor device 100 according to the embodiment of FIG. 2. Those features of the embodiment of FIG. 6 being similar to the features of the embodiment of FIG. 3 will not be described again and reference is drawn to the details given above. In detail, the cross-sectional views of the portion of the semiconductor device 100 taken along the section plane A-A' and along the section plane B-B' of FIG. 6 are comparable to that of FIG. 3 and have been already discussed with regard to FIGS. 4A and 4B. Thus, only the cross-sectional view along the section plane D-D' will be discussed in the following.

Figure 7A:
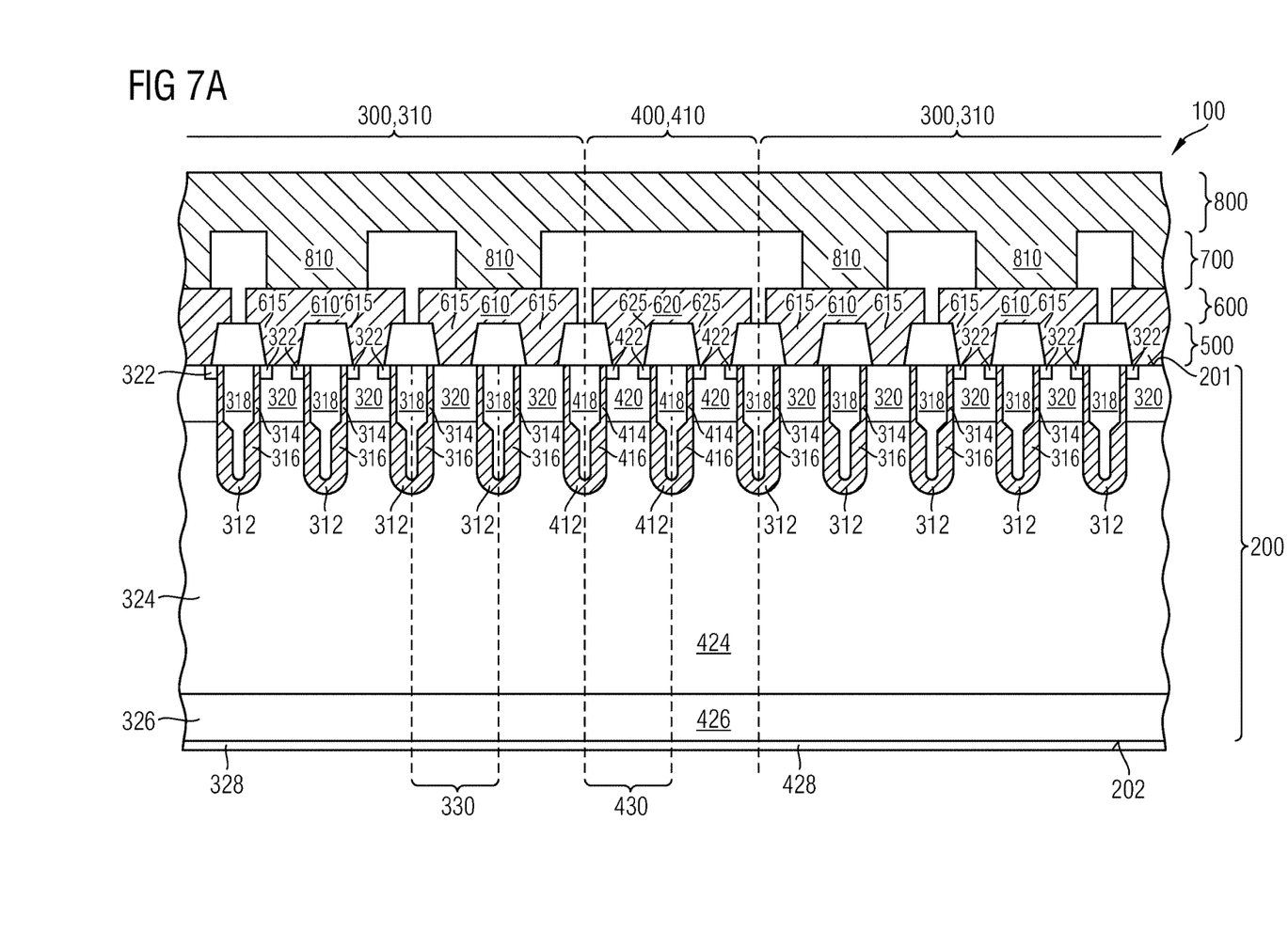
FIG. 7A to 7C are schematic cross-sectional views of a portion of a semiconductor device taken along the section plane D-D' of FIG. 6 according to different embodiments.
Figure 7B:
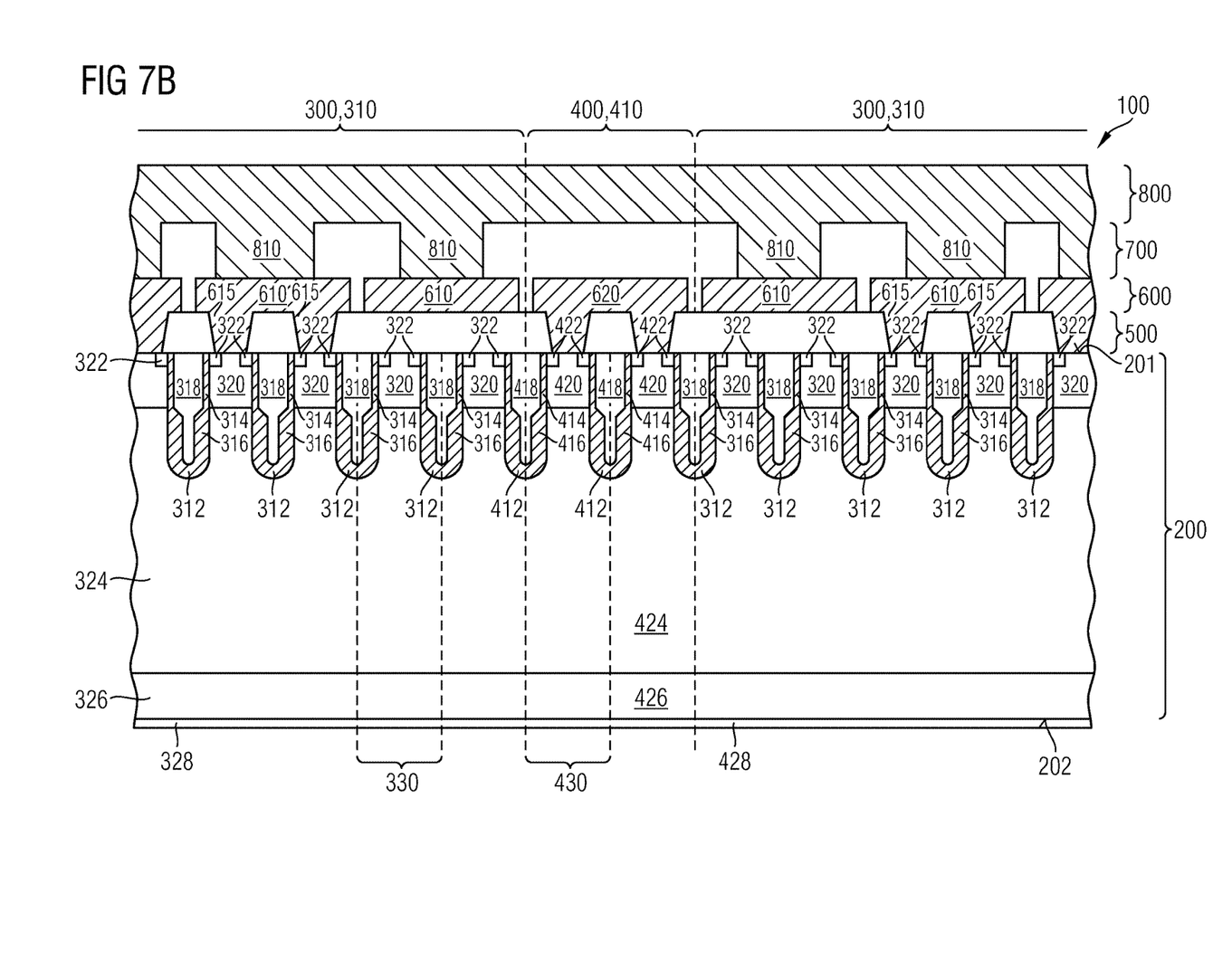
Figure 7C:
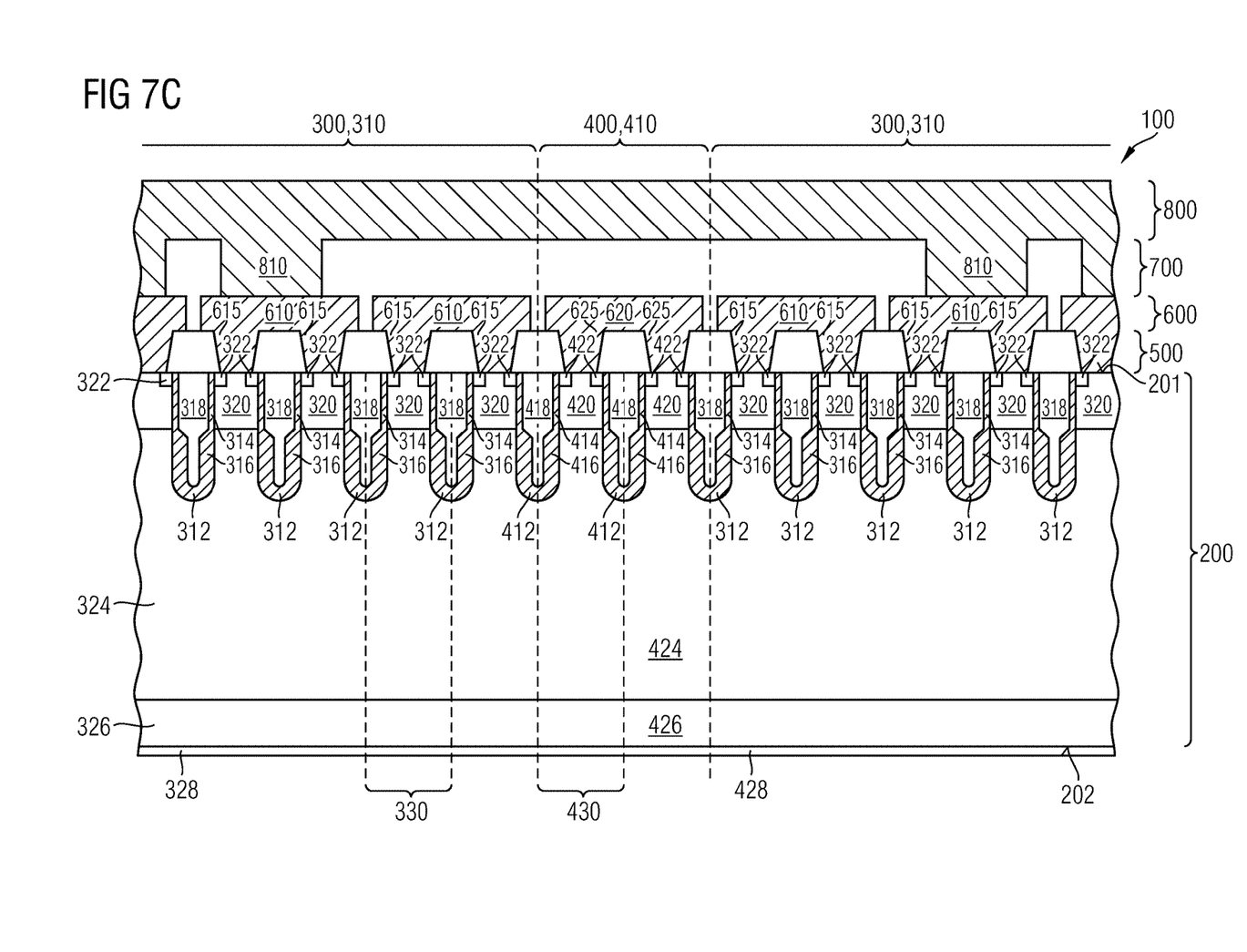

FIG. 7A to 7C show cross-sectional views of a portion of the semiconductor device 100 taken along the section plane D-D' of FIG. 6 according to different embodiments.

As shown in FIG. 7A, the source zones 322 are absent in the second transistor area part 360 of the load current transistor area 310. Thus, no current flows from the second wiring layer 800 through the vias 810 to the further electric contact structure 615 into the semiconductor body 200. The absent load current transistor area element 490 is thus a source region comprising the source zones 322 of the load current transistor area 310 at the first surface 201 of the semiconductor body 200. The second transistor area part 350 is thus electrically disconnected from a parallel connection of the first and second transistor area parts 350, 360. As can be seen from FIG. 7A, all transistor units 330 of the load current transistor area 310 are connected in parallel by means of the vias 810 connected to the second wiring layer 800, which covers the complete load current transistor area 310. Thus, the second transistor area part 360 is not only electrically disconnected from a parallel connection of the first and second transistor area parts 350, 360, but from a parallel connection of all remaining parts of the load current transistor area 310 beside the second transistor area part 360.

FIG. 7B is a schematic cross-sectional view of a portion of a semiconductor device 100 taken along the section plane D-D' of FIG. 6 according to another embodiment. Those features of the embodiment of FIG. 7B being similar to the features of the embodiment of FIG. 7A will not be described again and reference is drawn to the details given above. As can be seen from FIG. 7B, the absent load current transistor area element 490 is the further electric contact structure 615 electrically connecting the load current contact structure 610 with a source region comprising the source zones 322 of the load current transistor area 310.

In another embodiment as shown in FIG. 7C, no vias 810 are provided in the second transistor area part 360 between the first and third transistor area parts 350, 470. The load current transistor area element 490 being absent in the second transistor area 360 is an electric connection structure (the vias 810) electrically connecting the second wiring layer 800 with the load current contact structure 610, which extends through the second isolation layer 700. According to this embodiment, the load current contact structure 610 may be electrically connected in parallel by means of the vias 810 and the second wiring layer 800 only, without any electric coupling between the conductive lines of the load current contact structure 610. The absent vias 810 lead to an electric disconnection of the second transistor area part 360 from a parallel connection of the first and second transistor area parts 350, 470. Since no current flows through the second transistor area 360 directly neighbouring the sensor transistor area 410 of the sensor component 400, an increase of temperature of the sensor component 400 may be reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a semiconductor body having a first surface and a second surface opposite to the first surface, the semiconductor body comprising:
    a load current component comprising a load current transistor area; and
    a sensor component comprising a sensor transistor area,
    wherein the sensor component is operable to supply a current proportional to a load current flowing through the load current component,
    wherein the sensor transistor area is at least partly surrounded by the load current transistor area, or arranged at a boundary portion of one or more sides of the load current transistor area,
    wherein the sensor transistor area comprises first and third transistor area parts differing from a second transistor area part between the first and the third transistor area parts by a sensor transistor area element being absent in the second transistor area part,
    wherein the second transistor area part is electrically disconnected from a parallel connection of the first and the third transistor area parts by the sensor transistor area element being absent in the second transistor area part.

2. The semiconductor device of claim 1, wherein the sensor transistor area element is a source region of the sensor transistor area.

3. The semiconductor device of claim 1, wherein the sensor transistor area element is an electric contact structure on a source region of the sensor transistor area.

4. The semiconductor device of claim 1, wherein the first to third transistor area parts are arranged along a first lateral direction such that source regions of the first and the third transistor area parts are electrically coupled by a conductive line extended along the first direction.

5. The semiconductor device of claim 1, further comprising:
- a first isolation layer on the first surface of the semiconductor body;
- a first wiring layer on the first isolation layer, the first wiring layer comprising a load current contact structure electrically coupled to the load current transistor area and a sensor contact structure electrically coupled to the sensor transistor area;
- a second isolation layer on the first wiring layer; and
- a second wiring layer on the second isolation layer overlapping the load current transistor area and the sensor transistor area, the second wiring layer being electrically coupled to the load current contact structure and isolated from the sensor contact structure.

6. The semiconductor device of claim 5, wherein the load current contact structure and the sensor current contact structure comprise conductive lines extending in parallel.

7. The semiconductor device of claim 5, wherein the sensor transistor area element is a source region of the sensor transistor area at the first surface of the semiconductor body.

8. The semiconductor device of claim 5, wherein the sensor transistor area element is an electric contact structure electrically connecting the sensor contact structure with a source region of the sensor transistor area, the electric contact structure extending through the first isolation layer.

9. The semiconductor device of claim 1, wherein source regions of the sensor transistor area and source regions of the load current transistor area are at the first surface and a common drain region is at the second surface of the semiconductor body.

10. The semiconductor device of claim 9, wherein the load current component comprises a first trench and the sensor component comprises a second trench, the first and second trenches each comprising a gate electrode, the gate electrodes being electrically coupled with each other.

* * * * *